United States Patent [19]

Onodera et al.

[11] 4,318,164

[45] Mar. 2, 1982

[54] HIGH FREQUENCY SWITCHING CIRCUIT HAVING PRESELECTED PARAMETERS TO REDUCE POWER DISSIPATION THEREIN

[75] Inventors: Toshihiro Onodera, Kunitachi; Youichi Masuda, Yokohama; Akira Nakajima, Yokosuka, all of Japan

[73] Assignee: Tokyo Shibaura Denki Kabushiki Kaisha, Japan

[21] Appl. No.: 129,405

[22] Filed: Mar. 11, 1980

[30] Foreign Application Priority Data

Mar. 15, 1979 [JP] Japan .................................. 54/30480
Mar. 15, 1979 [JP] Japan .................................. 54/30481
Mar. 15, 1979 [JP] Japan .................................. 54/30482

[51] Int. Cl.³ ............................................. H02P 13/22
[52] U.S. Cl. ...................................... 363/21; 323/222; 330/297
[58] Field of Search ................... 323/17, DIG. 1, 222; 363/16, 18–21, 97, 131; 330/297

[56] References Cited

U.S. PATENT DOCUMENTS 4,218,660 8/1980 Carver ................................ 330/297

FOREIGN PATENT DOCUMENTS 1059720 2/1967 United Kingdom ................... 363/21
2018530 10/1979 United Kingdom ................... 363/21

OTHER PUBLICATIONS

Class E-A New Class of High Efficiency Tuned Single Ended Switching Power Amplifiers, Sokal et al., IEEE Journal of Solid State Circuits, vol. SC 10, No. 3, 6/75.
A New Optimum Topology Switching DC-TO-DC Converter, Cuk et al., IEEE PESC Record (No. 77 CH 1213-8 AES), 6/77.
Japanese Patent Disclosure 47-41118, Beatus (transliterated) filed 4/20/72.

Primary Examiner—William H. Beha, Jr.
Attorney, Agent, or Firm—Finnegan, Henderson, Farabow, Garrett & Dunner

[57] ABSTRACT

A high frequency switching circuit in which, to reduce power dissipation of a switching element, the characteristic impedance defined by the inductance of a transformer connected in series with the switching element and the capacitance of a capacitor connected in parallel with the switching element, the ratio of the input voltage and an output voltage, and the ratio of ON time and a switching period T of the switching element are each selected within a given range. Alternatively, a ratio pertaining to a leakage inductance of the transformer and an inductance of an additional inductor, and a ratio pertaining to the output and input voltages are selected to satisfy a predetermined relation and the characteristic impedance is selected within a given range.

4 Claims, 12 Drawing Figures

HIGH FREQUENCY SWITCHING CIRCUIT HAVING PRESELECTED PARAMETERS TO REDUCE POWER DISSIPATION THEREIN

The invention relates to a high frequency switching circuit suitable for a switching regulator of electronic devices and a variable voltage source for improving efficiency of an audio amplifier.

Recently, small-sized, high efficiency switching power sources have often been used as a low voltage and large current DC power source for a semiconductor circuit, particularly an integrated circuit. Efforts have been made to improve the switching power source in its size and efficiency. One of the measures for improving the switching power supply is to increase the switching frequency of a switching element such as a transistor to about 100 KHz.

Problems accompanied by increase of the switching frequency involve a capacitance between the collector and emitter of a switching transistor, a leakage inductance of a transformer and the like. If those factors are not sufficiently taken into consideration in designing a high frequency switching circuit undesirable transient responses would result.

In an ordinary switching power source, voltage across the semiconductor switching element and current flowing therethrough overlap each other on the time base, so that the power dissipation of the switching element or switching loss is relatively large to reduce power transmission efficiency. N. O. Sokal et al proposed a "Class E high efficiency tuned single-ended switching power amplifier" in IEEE Vol. SC-10 Page 168, June 1975. The Class E amplifier is so designed that, by appropriately designing an LC circuit construction, values of an inductor and a capacitor, and the ratio of a switching period and an ON duration of a switching transistor, the collector current becomes zero before the switching transistor is turned off, and the collector-emitter voltage becomes zero before the switching transistor is turned on. The approach therefore remarkably reduces energy dissipation by the switching transistor so that the power transmission efficiency is improved.

Class E operation is impossible by a switching power source in which the load network includes a rectifying diode and to which this invention is directed. In the switching power source, however, by positively taking advantage of a stray capacitance of the switching element and a leakage inductance of transformer, it is possible to realize little switching loss even at the switching speed of about 100 KHz.

It is an object of this invention to provide an improved high frequency switching circuit with reduced power dissipation of a switching element.

It is another object of this invention to provide an improved high frequency switching circuit in which overlapping of a waveform of current flowing through a switching element and a waveform of voltage across the switching element is avoided by causing the voltage across the switching element to be zero during the ON state of the switching element, and the voltage across the switching element to begin to rise after the current flowing through the switching element becomes zero during the OFF state of the switching element.

A switching circuit according to the invention is comprised of an input power source, a switching element and choke coil or the primary winding of a transformer connected in series across the input power source, a resonant capacitor connected in parallel with the switching element, a damper diode connected in parallel with the resonant capacitor, a load network connected across the choke coil or the secondary winding of the transformer and including a rectifying element and a smoothing capacitor, and a pulse source for applying a switching pulse to the switching element to turn the switching element on or off.

When the choke coil is used or a leakage inductance of the transformer is negligible, in order to operate the switching power source in such an operation mode that the waveform of the current flowing through the switching element does not overlap with the waveform of the voltage across the switching element, a characteristic impedance $Z_o = \sqrt{L/C}$ defined by an inductance L of the choke coil or primary winding of the transformer and a capacitance C of the resonant capacitor, and the ratio $T_{ON}/T$ of ON time $T_{ON}$ and switching period T of the switching element are determined such that voltage across the switching element rises gradually up to at least a level which enables the rectifying element to be conductive after the switching element is rendered OFF, and then decays gradually down to zero volts before the switching element is rendered ON by a switching pulse supplied from the switching pulse source. More specfically, the characteristic impedance $Z_o$ ranges from 0.5 Ohm to 500 Ohms, and the ratio $T_{ON}/T$ ranges from 0.05 to 0.5. The ratio $E_o/E_i$ of an output voltage $E_o$ and an input voltage $E_i$ is set in a range from 1 to 3.

When the leakage inductance of the transformer is not negligible, an additional inductor or coil is connected in series with the secondary winding of the transformer. In this arrangement, the sum of a leakage inductance of the transformer and an inductance of the additional coil is referred to the primary side to obtain a primary-referred inductance $L_e$, and the output voltage $E_o$ is referred to the primary side to obtain a primary-referred output voltage $E_o'$. To achieve the above-mentioned operation mode, the ratio $E_o'/E_i$ of the primary-referred output voltage $E_o'$ and input voltage $E_i$ and the ratio of the primary-referred inductance $L_e$ and an inductance L of the primary winding are selected, in a co-ordinate with the abscissa of $E_o'/E_i$ and the ordinate of $L_e/L$, within an area enclosed with a point P $(0.4=E_o'/E_i, 0.8=L_e/L)$, a point Q (0.7, 0.8), a point A (1.0, 0.7), a point R (1.3, 0.44), a point S (1.54, 0.1), a point T (10.0, 0.1), a point U (10.0, 10.0) and a point O (0.4, 10.0); and a characteristic impedance $Z_o = \sqrt{L/C}$ defined by the inductance L of the primary winding and a capacitance C of the resonant capacitor is ranged from 0.5 Ohm to 500 Ohms.

In the switching power source of the invention, to regulate the output voltage for variation in the input voltage, the information relating to an error of the output voltage and the information relating to the switching period of the switching element are fed back to the switching element.

Other objects and features of the invention will be apparent from the following description taken in connection with the accompanying drawings.

Figure 1:
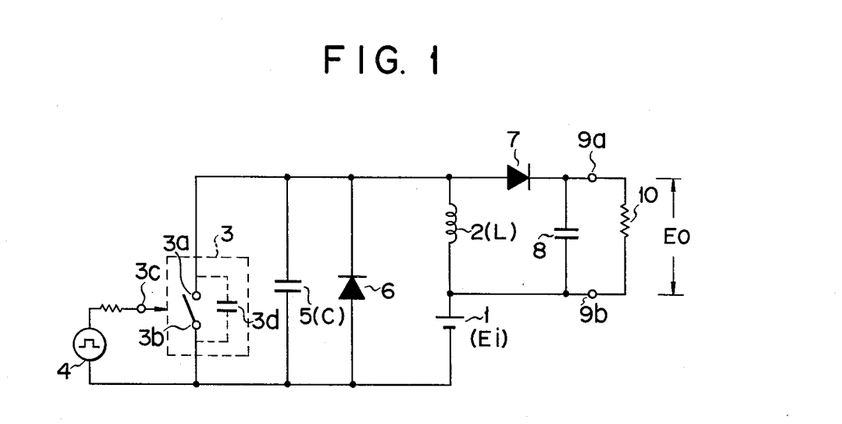
FIG. 1 is a schematic circuit diagram of a switching power source according to an embodiment of the invention.

Referring to FIG. 1, there is shown a switching power source according to an embodiment of the invention in which a load network is connected across a choke coil with no leakage inductance. In the figure, reference numeral 1 designates an unregulated DC power source across which are connected in series a choke coil 2 for power transmission and a switching element 3 such as a transistor. The switching element 3 is supplied at its control terminal 3c (the base of a transistor) with a switching pulse from a pulse generator 4. The switching element 3 has an inherent stray capacitance 3d equivalently existing between terminals 3a and 3b. A resonance capacitor 5 having a much larger capacitance than the stray capacitance of the switching element 3 and a damper diode 6 are each connected in parallel with the switching element 3. Voltage developed across the choke coil 2 is rectified by a rectifier diode 7, and smoothed by a smoothing capacitor 8. A DC output voltage thus formed is applied to a load 10 connected to output terminals 9a and 9b.

The operation of the switching power source of FIG. 1 will be described referring to waveform diagram of FIG. 3.

Figure 3:
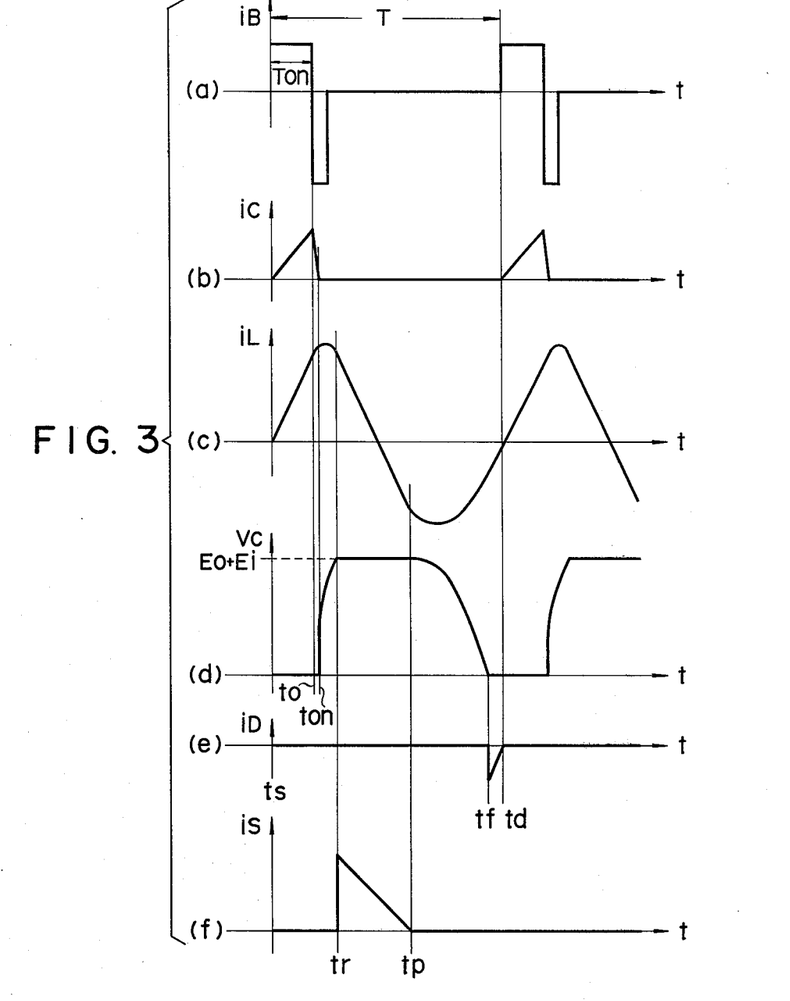
FIG. 3 is a set of waveforms useful in explaining the operation of a switching power source of FIG. 1.

When a switching pulse as shown in FIG. 3(a) is applied to the control terminal 3c of the switching element 3, the switching element 3 is periodically turned on. Since ON resistance of the switching element 3 is selected to be sufficiently smaller than the impedance of the choke coil 2, current $i_c$ flows through the choke coil 2 and the switching element 3 during the ON state of the switching element 3 which, as shown in FIG. 3b, linearly increases from $t_s$ to $t_o$. The switching element 3 is forcibly turned off during a short period between $t_o$ to $t_{ON}$, so that the current $i_c$ rapidly decays to zero. After the current $i_c$ becomes zero, current $i_L$ of the choke 2 still continues its flow into the capacitor 5 and the stray capacitor 3d of the switching element 3, as shown in FIG. 3(c), due to inertia of the coil. Because the resonant capacitor 5 has a larger capacitance than the stray capacitance 3d, the current flows mainly through the resonant capacitor 5. There after the resonant current, changing with cosine curve, flows through the choke coil during a period $t_{ON}$ to $t_r$, as shown in FIG. 3(c). On the other hand, the voltage $V_c$ across the resonant capacitor 5, i.e., the voltage across the switching element 3, rises the moment the resonant current starts to flow through the resonant capacitor 5, while tracing a sine curve during the period $t_{ON}$ to $t_r$, as shown in FIG. 3(d). The rising slope of the voltage $V_C$ is more gentle than that in the absence of resonant capacitor 5. Therefore, at a point of time $t = t_o$ when the switching element 3 is turned off, the waveform of the current $i_c$ flowing through the switching element 3 never overlaps with the waveform of the voltage $V_c$ across the switching element. Even if those waveforms overlap each other, the overlapping area of the waveforms will be fairly small because the rising slope of the voltage $V_c$ is gentle as mentioned above. In other words, the power dissipation of the switching element is remarkedly reduced.

The voltage $V_c$ across the switching element 3 continues its rising due to the resonance existing between the choke coil 2 and the capacitor 5. At a time point $t = t_r$ when the voltage $V_c$ reaches the sum of a voltage $E_i$ of the input DC power source 1 and a regulated output voltage $E_o$ between output terminals 9a and 9b, the rectifying diode 7 starts to conduct. As a result, energy stored in the choke coil 2 is supplied through the diode 7 to the load 10. In the circuit configuration shown in FIG. 1, the voltage $V_c$ does not rise so long as the rectifying diode 7 is conductive. During the period $t_r$ to $t_p$ in which the diode 7 is conductive, the current $i_L$ linearly decreases with time, as shown in FIG. 3c, if the impedance of the smoothing capacitor 8 is much smaller than resistance of the load 10. At the same time, current $i_s$ flows through the diode 7 which decreases linearly with time as shown in FIG. 3(f). When the voltage $V_c$ falls below $E_i + E_o$, the diode 7 is turned off and the capacitor 5 is in a discharge state, so that the voltage $V_c$ decreases, plotting a cosine curve as shown in FIG. 3d. After time $t_f$, the voltage $V_c$ will go negative but it is kept zero since the damper diode 6 conducts. The damper current $i_D$ decreasingly flows during a period $t_f$ to $t_d$, as shown in FIG. 3(e). At time point $t_d$, the pulse generator 4 applies the next succeeding switching pulse to the switching element 3, so that the above-mentioned operation is repeated. During the period in which the damper current $i_D$ flows, the voltage $V_c$ across the switching element 3 is zero and therefore the waveforms $i_c$ and $V_c$ never overlap each other at the time point $t_d$ that the switching element 3 is subsequently turned on.

The output power $P_{out}$ supplied to the load 10 is $$\frac{1}{T} \int_0^T E_o \times i_s \, dt.$$

In FIG. 3, $T_{ON}$ is a ON duration of the switching element 3 and T is a switching period thereof.

Figure 4:
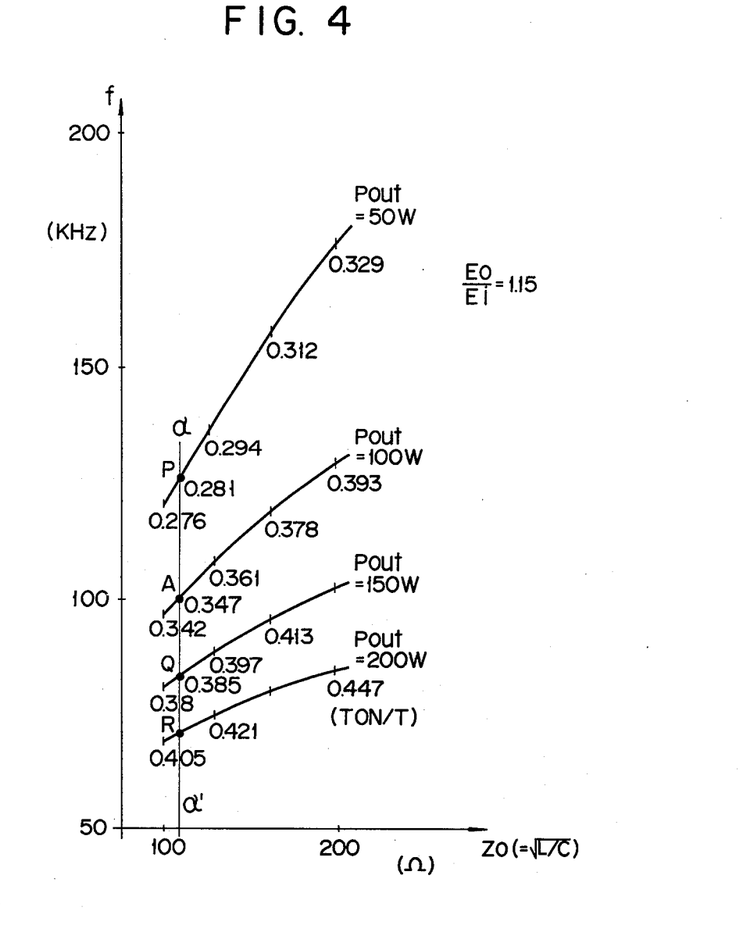
FIG. 4 shows characteristic impedance $Z_o = \sqrt{L/C}$ of the switching power source in FIG. 1 vs. switching frequency characteristics with output power taken as a parameter.

For keeping the above-mentioned operation mode (referred to as a sub-Class E mode in this specification) in which there is no overlapping of the voltage $V_c$ and the current $i_c$, it is required that $T_{ON}/T$ of the switching element be properly selected, the inductance L of the choke coil be properly related to the capacitance C of the resonant capacitor and to the current flow through the damper diode. To sustain the sub-Class E mode, the output power $P_{out}$, the switching frequency $f (= 1/T)$, the L and C are strictly selected and the ON duration of the switching element is determined on the basis of these values selected. FIG. 4 shows characteristics between a root of the ratio of L and C, i.e. a characteristic impedance $Z_o = \sqrt{L/C}$, and a switching frequency $f(=1/T)$ for keeping the sub-Class E mode with the ratio $E_o/E_i$ of the output voltage $E_o$ and the input voltage $E_i$ fixed at 1.15, the output power $P_{out}$ taken as a parameter. Values of the ratio $T_{ON}/T$ are given on each curve. For example, at a point A where $P_{out} = 100$ W, $F = 100$ KHz and $Z_o = 106$ Ohms, $T_{ON}/T \approx 0.347$ and accordingly $T_{ON} \approx 3.47$ μsec. In order to vary $P_{out}$ when $Z_o = 106$ Ohms, $T_{ON}/T$ and f must be varied along a line $\alpha - \alpha'$. Thus, at a point P (50 W), $T_{ON}/T = 0.28$ and $f = 126$ KHz. At a point Q (150 W), $T_{ON}/T = 0.385$ and $f = 83$ KHz. For adjusting the output voltage $P_{out}$ while keeping the sub-Class E mode, $T_{ON}/T$ and f, that is, $T_{on}$ and T, must be changed simultaneously.

Figure 2:
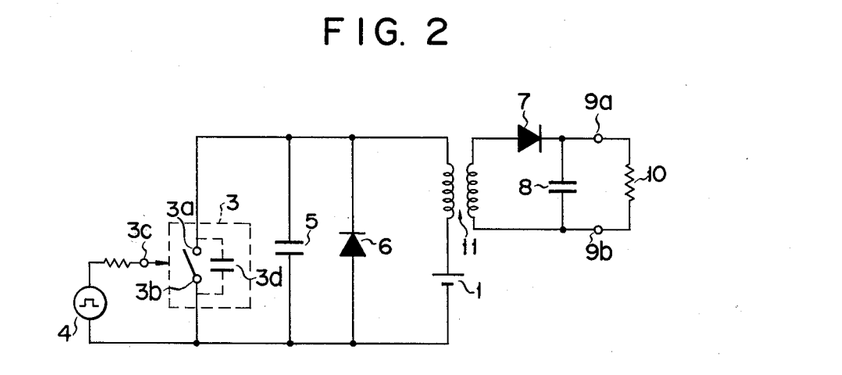
FIG. 2 is a schematic circuit diagram of another embodiment of the switching power source of the invention.

While $Z_o$ ranges 100 Ohms to 180 Ohms and $T_{ON}/T$ ranges 0.276 to 0.447 in the graph of FIG. 4, the result of experiments showed that $Z_o$ may range from 0.5 Ohm to 500 Ohms and $T_{ON}/T$ range from 0.2 to 0.5, when a range of $E_o/E_i$ is considered, to secure the sub-Class E mode. The ratio $E_o/E_i$ must range from 1 to 3, for the reason that, when the $E_o/E_i$ is smaller than 1, the diode 7 is always OFF and no power is transmitted to the load and that, when it is larger than 3, the leakage inductance of the transformer adversely affects the operation mode to disable the power supply from keeping the sub-Class E mode. Although the embodiment shown in FIG. 1 employs the choke coil to supply power to the load, it may be replaced by a transformer 11 as shown in FIG. 2, so long as the leakage inductance is negligible. Incidentally, as the transformer ratio approaches 1:1, the leakage inductance may be made small. When the transformer is used, the characteristic impedance $Z_o$ may be determined by the inductance of the primary winding of the transformer and the capacitance of the resonant capacitor.

For changing properly the output voltage $E_{out}$ with respect to the input voltage $E_{in}$, a transformer is used for power transmission. In this case, if the transformer ratio approximates to 1:1, the leakage inductance may be made small to a negligible extent. If the transformer ratio approximates to 10:1, the leakage inductance is not negligible in operation.

Figure 5:
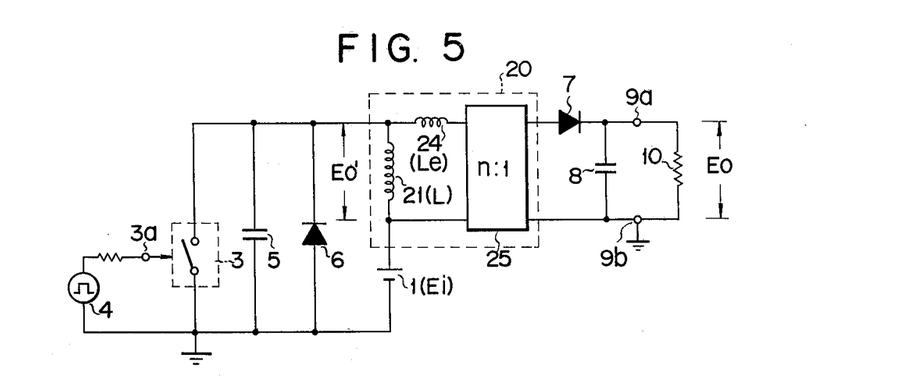
FIG. 5 shows a circuit diagram of yet another embodiment of the switching power source of the invention in which a transformer is illustrated in the form of an equivalent circuit.
Figure 6:
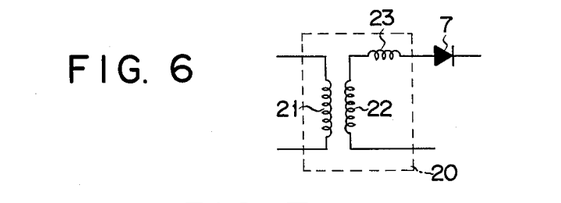
FIG. 6 is an actual circuit diagram of the transformer shown in FIG. 5.

The invention positively takes advantage of the leakage inductance of the transformer in designing a switching power source to ensure the sub-Class E mode. The switching power source thus designed as illustrated in FIG. 5. In the figure, like numerals are used to designate like or equivalent portions in FIG. 1. In FIG. 5, a transformer 20 is illustrated in the form of an equivalent circuit and its actual circuit expression is depicted in FIG. 6. As shown in FIG. 6, a coil 23 is additionally connected in series with the secondary winding 22 of the transformer 20. Accordingly, the equivalent circuit of the transformer 20 may be depicted as shown in FIG. 5, including the primary winding 21 (inductance L) of the transformer 20, an inductor 24 having an inductance $L_e$ which is obtained by referring, to the primary side, the sum of a leakage inductance of the transformer 20, and an inductance of the additional coil 23, and an ideal transformer 25 with the transformer ratio n:1.

Figure 8:
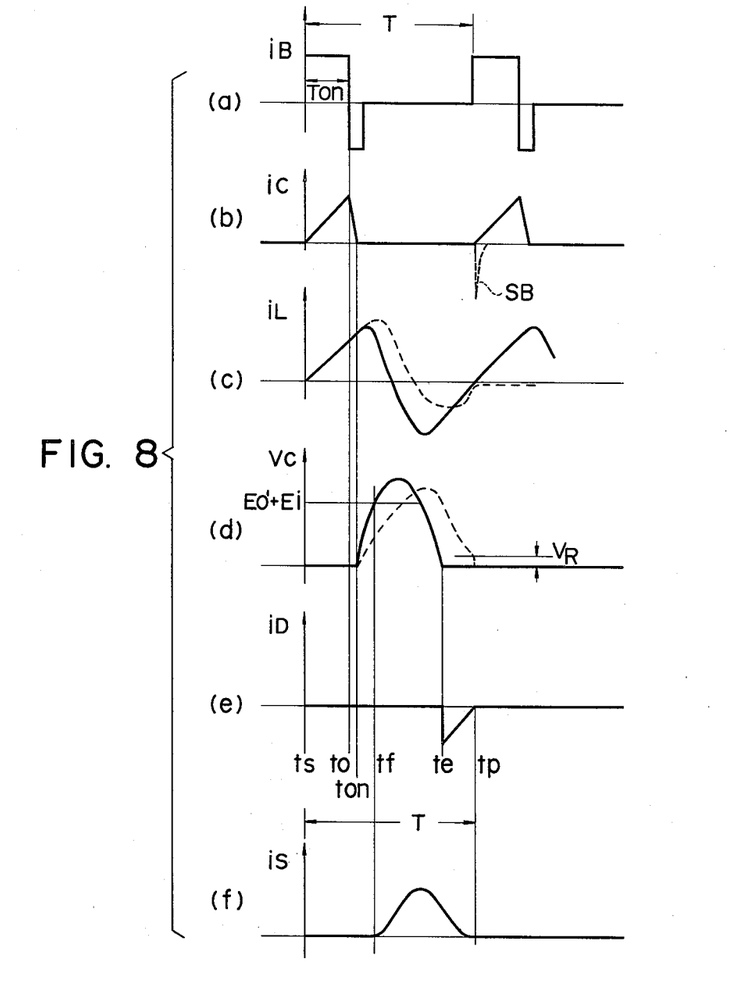
FIG. 8 is a set of waveforms for illustrating the operation of the switching power source of FIG. 5.

The operation of the embodiment of FIG. 5 will be described referring to FIG. 8. Upon application of a switching pulse shown in FIG. 8(a) to the switching element 3, current $i_c$ shown in FIG. 8b flows through the switching element 3 through the primary winding 21. During a period $t_{ON}$ to $t_e$ following OFF of the switching element 3, through the primary winding of the transformer 20 a cosine resonance current flows which has a resonant frequency dependant on the capacitance C of the resonant capacitor 5 and the inductance L of the primary winding 21 as shown in FIG. 8(c). As the resonance current begins to flow through the capacitor 5, the voltage $V_c$ across the capacitor 5 increases along a sine curve, as shown in FIG. 8(d). At a time point $t_f$ when the voltage $V_c$ exceeds the sum $E_i + E_o'$ of the input voltage $E_i$ and a primary side referred voltage $E_o' (=nE_o)$ of the output voltage $E_o$, the rectifying diode 7 conducts and the current $i_s$ starts to flow, as shown in FIG. 8(f). Because of the presence of a relatively large equivalent leakage inductance $L_e$ which is several tens percents or more of the primary winding inductance, the voltage $V_c$ is not clipped at $E_i + E_o'$ and changes as plotted in FIG. 8(d). Even after the voltage $V_c$ falls below $E_i + E_o'$ energy stored in the leakage inductance 24 of the transformer causes current $i_s$ to flow through the rectifying diode 7 up to time $t_p$, as shown in FIG. 8(f). After the voltage $V_c$ becomes zero, the current $i_L$ flowing through the primary winding 21 of the transformer 20 flows through the damper diode 6, during a period $t_e$ to $t_p$ as shown in FIG. 8(e).

In order that the current $i_c$ and the voltage $V_c$ do not overlap each other each time $t_{ON}$ when the switching element 3 is turned OFF and at time $t_p$ when the switching element is turned ON, that is to say, in order to achieve the sub-Class E operation mode, factors $T_{ON}$, T, L, $L_e$, C, $E_i$, and $E_o'$ must be properly selected. If not so done, a voltage $V_R$ remains in the capacitor 5 at time $t_p$, as shown in FIG. 8(d), and the residual voltage abruptly discharged through the switching element 3 to produce a negative spike pulse SB.

Figure 7:
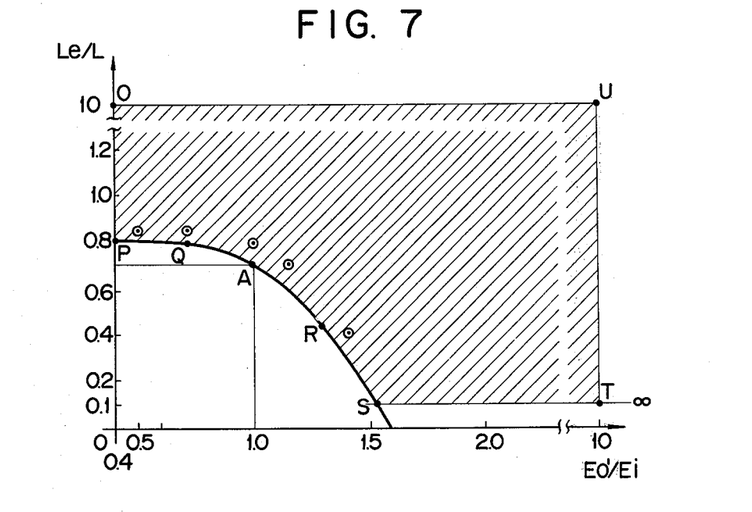
FIG. 7 is a graph for illustrating an area within which ratios $L_e/L$ and $E_o'/E_i$ should fall in the switching power source of FIG. 5.

In order to achieve the sub-Class E mode, $L_e/L$ and $E_o'/E_i$ must be selected so as to fall within a hatched area in FIG. 7, i.e. an area enclosed by a line connecting a point P (0.4 = $E_o'/E_i$, 0.8 = $L_e/L$), a point Q (0.7, 0.8), a point A (1.0, 0.7), a point R (1.3, 0.44), a point S (1.54, 0.1), a point T (10.0, 0.1), a point U (10.0, 10.0), and a point O (0.4, 10.0). In FIG. 7, the ordinate represents $L_e/L$ and the abscissa $E_o'/E_i$.

Selection of L and C will be described hereinafter.

When, in the circuit of FIG. 5, the primary winding inductance L of the transformer 20, current $i_L$ and $i_{Le}$ respectively flowing through the primary winding and equivalent inductance $L_e$, and the voltage $V_c$ across the resonant capacitor 5 are taken as stated variables, the following equation holds:

$$\dot{X} = (dx)/(dt) = AX + B$$

where $$A = \begin{bmatrix} 0 & 0 & -1/L \\ 0 & -R_{D1}/L_e & 1/L_e \\ 1/C & -1/C & -1/CR_{D2} \end{bmatrix}$$

Figure 9:
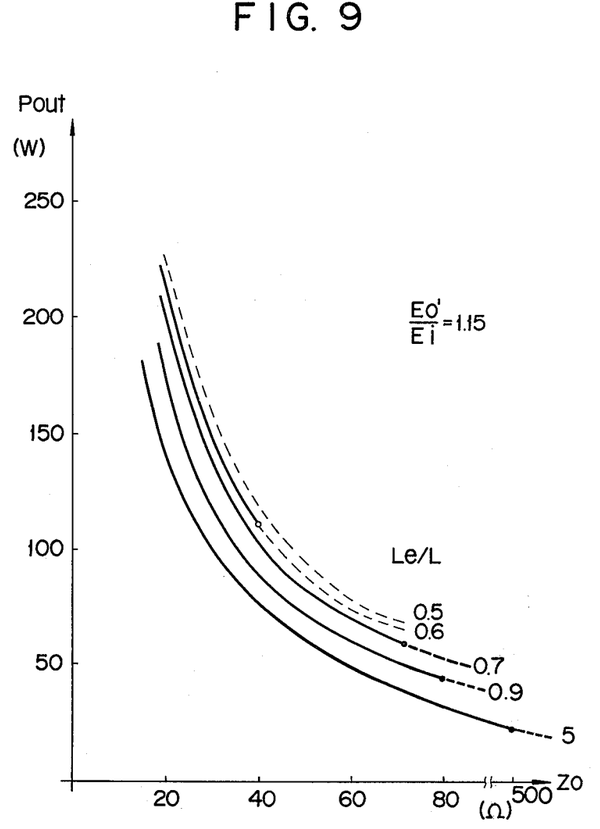
FIG. 9 shows characteristic impedance of the switching power source in FIG. 5 vs. the output voltage characteristics with $L_e/L$ taken as a parameter.

$B = (E_i/L, -E_o' + E_iL_e, 0)^T$
$X = (i_L, i_{Le}, V_c)^T$ and T represents transversal vector.
When the Runge-Cutter-Gille method is applied to the above equation for waveform-analysis, there are obtained characteristics of the output power $P_{out}$ with respect to the characteristic impedance $Z_o = \sqrt{L/C}$ as a variable with the ratio $L_e/L$ taken as parameter, as shown in FIG. 9. In the $P_{out}$ vs. $Z_o$ characteristics of FIG. 9, the characteristic impedance $Z_o$ was changed from 20 Ohms to 500 Ohms for each of values 0.5, 0.6, 0.7, and 0.9 of $L_e/L$ when $E_o'/E_i=1.15$. In the case of the curve of $L_e/L=0.5$ as indicated by a dotted line in FIG. 9, which falls outside the hatched area of FIG. 7, the switching power source is in a state that the voltage $V_R$ remains in the resonant capacitor 6 at time $t_p$ in FIG. 8, that is, the power source is out of the sub-Class E mode. In the case of the characteristic curve of $L_e/L=0.6$, the switching power source is in the sub-Class E mode in a range of $20 \leq Z_o \leq 40$ shown by a solid curve, while it is out of the sub-Class E mode in a range of $40 < Z_o$ shown by a broken curve. When the parameter $L_e/L$ is 0.7, the switching power source is in the sub-Class E mode in a range of $20 \leq Z_o \leq 70$. In the case of $L_e/L=0.9$, the switching power source in the sub-Class E mode when $Z_o$ ranges from 20 Ohms to 80 Ohms. The effective range of $Z_o$ becomes greater as the parameter $L_e/L$ becomes greater. According to experiments, $Z_o$ may range from 0.5 Ohm to 500 Ohms.

Figure 10:
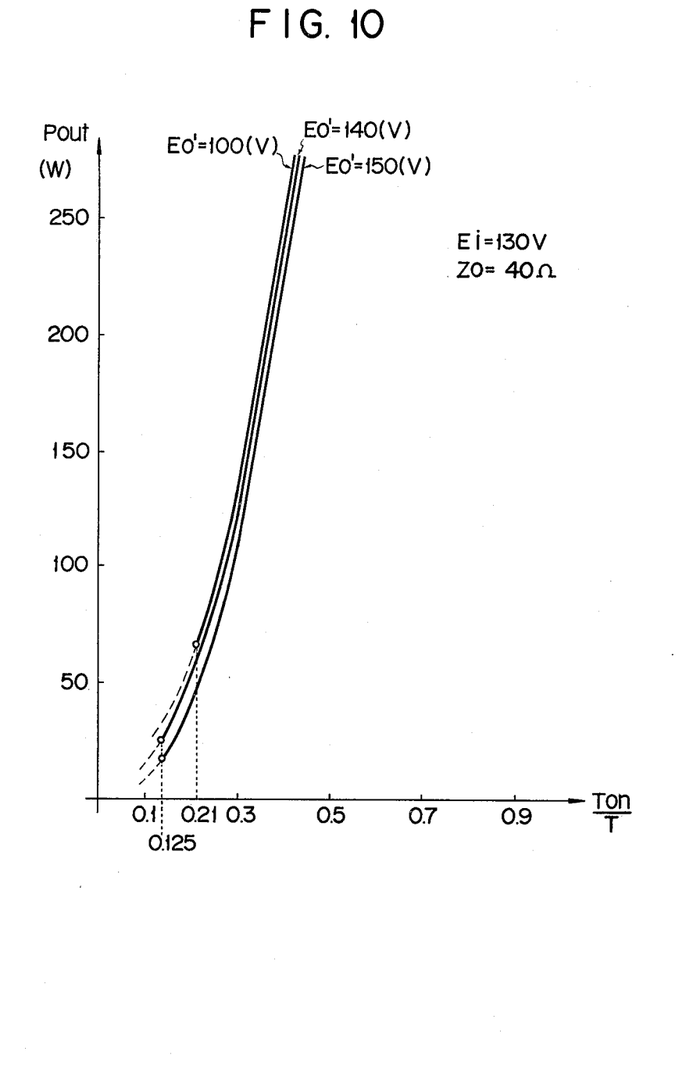
FIG. 10 shows ratio $T_{ON}/T$ of the ON duration $T_{ON}$ and switching period T of the switching power source of FIG. 5 vs. output power characteristics.

FIG. 10 shows output power $P_{out}$ vs. ratio $T_{ON}/T$ characteristics with $E_o'$ taken as parameter. The switching power source is out of the sub-Class E mode in a range as indicated by a broken line of each curve in the graph.

If $Z_o$, $E_o/E_i$ and $T_{ON}/T$ are determined as described above, the sub-Class E mode is normally achieved. However, when the load or input voltage varies due to external disturbances, the output voltage varies as well. For this reason, the output voltage $E_o$ must be regulated. Regulation of output voltage can be achieved normally by changing the switching period T or the ratio $T_{ON}/T$ of the switching element, but it is necessary to concurrently change T and $T_{ON}/T$ so as to regulate the output voltage while maintaining the sub-Class E mode. That is, when the load or input voltage varies there may be a possible occurrence that the voltage $V_c$ across the resonant capacitor does not become zero at $t_p$ as shown by a dotted line in FIG. 8(d). If, under this condition, the switching transistor 3 is rendered conductive by the next succeeding switching pulse, then a keen spike pulse is produced as shown at SB in FIG. 8(b) so that noises of high frequency components are produced. Since, in this case, the waveforms of collector current $i_c$ of the transistor 3 and the spike pulse SB overlap on the time base, a power corresponding to the product of overlapping waveforms is dissipated in transistor 3 as heat, lowering the power transmission efficiency and necessitating a relatively large heat sink for the transistor 3. To avoid those disadvantages, therefore, it is necessary to change concurrently $T_{ON}/T$ and T in accordance with variation in the output voltage $E_o$ so as to render the switching transistor 3 conductive after the damper current $i_D$ flows through the damper diode 6, that is, $V_c$ becomes completely zero.

Figure 11:
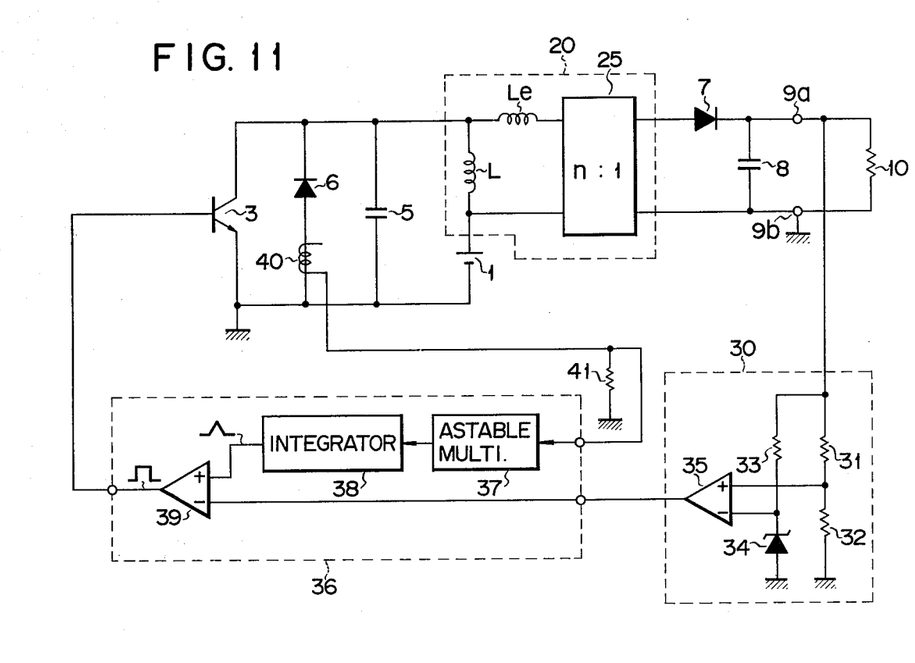
FIG. 11 is a schematic circuit diagram of a switching regulator according to the invention.

FIG. 11 is a circuit diagram of a switching circuit of the invention which is capable of the above-mentioned output voltage regulation. In the circuit, an error voltage detecting circuit 30 is connected to the output 9a to produce an error voltage proportional to a difference between the output voltage $E_o$ and a given voltage. As shown, the error voltage detecting circuit includes resistors 31 and 32 connected in series between the output terminal 9a and circuit ground, a resistor 33 and a Zener diode 34 connected in series between the output terminal 9a and circuit ground, and a differential or operational amplifier 35 having input terminals connected to a node between the resistors 31 and 32 and another node between the resistor 33 and the Zener diode 34, respectively.

The output of the error voltage detecting circuit 30 is connected to a pulse-width modulating circuit 36 having its output coupled with the base of switching transistor 3. The pulse width modulating circuit 36 includes an astable multivibrator 37, an integrating circuit 38 for converting a rectangular wave output from the astable multivibrator 37 into a triangle wave output, and a voltage comparator 39 for comparing the output voltage of the integrating circuit with the output voltage of the error voltage detecting circuit 36. The voltage comparator 39 produces a switching pulse having a pulse width proportional to an error voltage. The feedback system mentioned above is arranged, as well known, to control the ON time of switching transistor 3.

In this invention, to feed information related to a switching frequency back to the switching transistor, a current transformer 40 or hole sensor to detect the damper current flowing through the damper diode 6 is provided and the output current of current transformer 40 is converted into voltage by a resistor 41. The converted voltage is applied as a trigger signal to a trigger terminal of the astable multivibrator 37. The astable multivibrator 37 is forcibly synchronized with the trigger signal so that the output frequency of the astable multivibrator is pulled into the frequency of the damper current. As a result, the switching period T and the ratio of the ON time $T_{ON}$ to the switching period T are simultaneously changed, so that the output voltage $E_o$ is regulated while keeping the desired sub-Class E mode. It is evident that the feedback system may be applied to the switching power sources shown in FIGS. 1 and 2.

Good results were obtained by experimentation. The experiment used the input voltage $E_i=130$ V, the output voltage $E_o=28$ V, the output power $P_{out}=120$ W, and the switching frequency $=100$ KHz, a transformer having a primary winding of 28 turns and a secondary winding of 3 turns, as were various of $L=54$ $\mu H$, $L_e=49$ $\mu H$, $C=47,000$ pF and $T_{ON}=3$ $\mu sec$. The switching power source according to the invention has a little power dissipation, so that a small-sized heat sink may be used for the switching element. Further, unwanted noise is not produced.

The switching power source capable of changing the output voltage with respect to the input voltage $E_i$ properly, as shown in FIG. 5, is adaptable for a variable power source for making an audio amplifier high in efficiency. Such as application is illustrated in FIG. 12.

Figure 12:
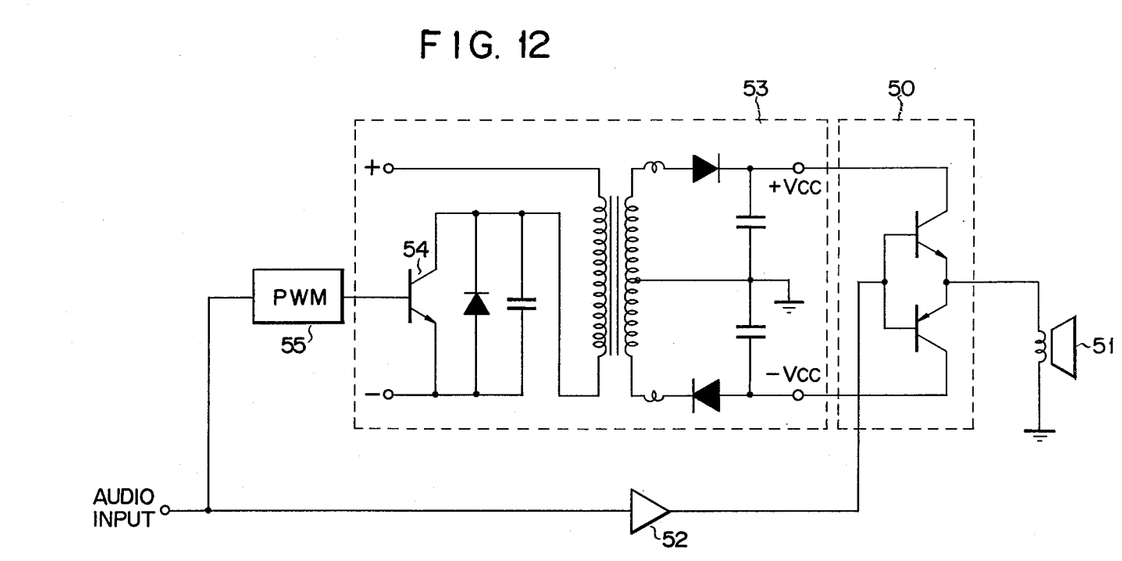
FIG. 12 is a circuit diagram of an audio amplifier using the switching power source of the invention as a variable voltage source.

In the example shown in FIG. 12, a main amplifier 50 coupled with a loudspeaker 51 is a Class B push-pull amplifier, and is supplied with an audio signal through a preamplifier 52. Positive and negative supply voltages $+V_{cc}$ and $V_{cc}$ for the main amplifier 50 are supplied from a variable switching power source 53. In this example, the variable switching power source 53 is designed as a source of positive and negative supply voltages under the same condition as described relating to the switching power source shown in FIG. 5. A pulse width modulator 55 receiving an audio input signal applies pulse width modulated switching pulses to the base of a switching transistor 54. The pulse width modulator 55 samples the audio input signal at a sampling frequency of 100 KHz, for example, and produces a switching pulse with a pulse width proportional to amplitude of each sample. The pulse width modulator 55 may be so designed as to change the ON duration $T_{ON}$ while keeping the switching period T constant or to change the ON duration $T_{ON}$ while keeping the OFF duration constant.

In the audio amplifier in FIG. 12, the magnitude of the power source voltages $+V_{cc}$ and $V_{cc}$ applied to the main amplifier 50 is proportional to the ON duration of the transistor 54. Accordingly, the magnitude of the power source voltages varies with an instantaneous amplitude of the audio signal applied for each sampling period. For this reason, the power converting efficiency of the main amplifier 50 is considerably improved, compared to that of the conventional audio amplifier constantly supplied with a fixed power source voltage.

What we claim is:

1. A switching circuit comprising an input power source; a switching element and an inductor connected in series across said input power source; a resonant capacitor connected in parallel with said switching element; a damper diode connected in parallel with said resonant capacitor, a load network coupled with said inductor and including a rectifying element and a smoothing capacitor; and a pulse source for applying switching pulses to said switching element to render said switching element ON or OFF, characterized in that a characteristic impedance $Z_o = \sqrt{L/C}$ defined by an inductance L of said inductor and a capacitance C of said resonant capacitor and the ratio $T_{ON}/T$ of ON time $T_{ON}$ and switching period T of said switching element are set such that the voltage across said switching element rises gradually up to at least a level which enables said rectifying element to be rendered conductive after said switching element is rendered OFF, and then gradually decays down to zero volt before said switching element is rendered ON by a switching pulse supplied from said switching pulse source, wherein the characteristic impedance $Z_o$ ranges from 0.5 ohm to 500 ohms, the ratio $E_o/E_i$ of voltage $E_i$ of said input power source and an output voltage $E_o$ of the switching circuit ranges 1 to 3, and the ratio $T_{ON}/T$ of the ON duration $T_{ON}$ of the switching element and the switching period T ranges from 0.05 to 0.5.

2. A switching circuit according to claim 1, further comprising error voltage producing means for producing an error voltage proportional to a difference between the output voltage of said switching circuit and a given voltage, and damper current detecting means for detecting a damper current flowing through said damper diode, and wherein said pulse source is so arranged as to change pulse width and period of the switching pulse in response to output signals of said error voltage producing means and said damper current detecting means.

3. A switching circuit according to claim 1, in which said pulse source is a pulse width modulator for modulating the pulse width of the switching pulse by an audio signal.

4. A switching circuit comprising an input power source; a transformer having primary and secondary windings; a switching element connected in series with said primary winding of said transformer across said input power source; a resonant capacitor connected in parallel with said switching element; a damper diode connected in parallel with said resonant capacitor; a load network having a rectifying element and a smoothing capacitor and connected across said secondary winding of said transformer; and a pulse source for applying switching pulses to said switching element to render said switching element ON or OFF, characterized in that an inductor is additionally connected in series with said secondary winding of said transformer, that ratios $E_o'/E_i$ and $L_e/L$ are selected, in a co-ordinate with the abscissa of $E_o'/E_i$ and the ordinate of $L_e/L$, within an area enclosed with a point P (0.4=$E_o'/E_i$, 0.8=$L_e/L$), a point Q (0.7, 0.8), a point A (1.0, 0.7), a point R (1.3, 0.44), a point S (1.54, 0.1), a point T (10.0, 0.1), a point U (10.0, 10.0) and a point O (0.4, 10.0), said $E_i$ being an input voltage of said input power source, said $E_o'$ a primary-referred output voltage which is obtained by referring an output voltage $E_o$ to the primary side of said transformer, said L an inductance of said primary winding of said transformer and said $L_e$ a primary-referred inductance of the sum of a leakage inductance of said transformer and an inductance of said additional inductor, and a characteristic impedance $Z_o = \sqrt{L/C}$ defined by the inductance L of said primary winding of said transformer and a capacitance C of said resonant capacitor ranges from 0.5 ohm to 500 ohms.

* * * * *